United States Patent

Laskaris et al.

[11] Patent Number: 5,563,566
[45] Date of Patent: Oct. 8, 1996

[54] CRYOGEN-COOLED OPEN MRI SUPERCONDUCTIVE MAGNET

[75] Inventors: Evangelos T. Laskaris, Schenectady; Bizhan Dorri, Clifton Park; Robert A. Ackermann, Schenectady, all of N.Y.

[73] Assignee: General Electric Company, Schenectady, N.Y.

[21] Appl. No.: 555,952

[22] Filed: Nov. 13, 1995

[51] Int. Cl.⁶ .................................................. H01F 7/22
[52] U.S. Cl. ........................ 335/216; 62/51.1; 324/318; 505/893
[58] Field of Search ................. 335/216; 324/318–320; 505/892, 893; 62/51.1

[56] References Cited

U.S. PATENT DOCUMENTS

| | | |
|---|---|---|
| 5,291,169 | 3/1994 | Ige et al. . |
| 5,381,122 | 6/1995 | Laskaris et al. . |
| 5,410,286 | 4/1995 | Herd et al. . |
| 5,410,287 | 4/1995 | Laskaris et al. . |
| 5,414,360 | 5/1995 | Westphal et al. ............. 324/318 |
| 5,442,928 | 8/1995 | Laskaris et al. . |
| 5,448,214 | 9/1995 | Laskaris . |
| 5,485,088 | 1/1996 | Westphal et al. ............. 324/320 |

OTHER PUBLICATIONS

Recently filed U.S. patent application RD–24637, by E. T. Laskaris et al., entitled "Open MRI Superconductive Magnet with Cryogenic Fluid Cooling", Ser. No. 08/547085.

Recently filed U.S. patent application RD–24684, by E. T. Laskaris et al., entitled "Open MRI Superconductive Magnet with Cryogenic Fluid Cooling", Ser. No. 08/553738.

*Primary Examiner*—Brian W. Brown
*Assistant Examiner*—Ramon M. Barrera
*Attorney, Agent, or Firm*—Douglas E. Erickson; Marvin Snyder

[57] ABSTRACT

An open magnetic resonance imaging (MRI) magnet having longitudinally spaced-apart superconductive main coils surrounded by a dewar containing a cryogenic liquid (e.g., liquid helium) and boiled-off cryogenic gas (e.g., helium vapor). A condenser is in physical contact with the boiled-off vapor and is in thermal contact with a cold stage of a cryocooler coldhead so as to re-liquefy the vapor. This allows the coils to be surrounded by a single (not double) thermal shield which allows the coils structurally to be located closer to the magnet's open space which reduces magnet cost by reducing the amount of coil needed for the same-strength magnetic field.

10 Claims, 2 Drawing Sheets

CRYOGEN-COOLED OPEN MRI SUPERCONDUCTIVE MAGNET

BACKGROUND OF THE INVENTION

The present invention relates generally to a superconductive magnetic resonance imaging (MRI) magnet, and more particularly to such a magnet having an open design and cooled by a cryogenic liquid.

MRI systems employing superconductive or other type magnets are used in various fields such as medical diagnostics. Known superconductive magnet designs include closed magnets and open magnets. Closed magnets typically have a single, tubular-shaped superconductive coil assembly having a bore and are cooled by liquid helium or a cryocooler. With cryocooler cooling of a closed magnet, the superconductive coil assembly includes a superconductive main coil which is surrounded by a single thermal shield which is surrounded by a vacuum enclosure, and the closed magnet also includes a cryocooler coldhead having a housing attached to the vacuum enclosure, a first stage in solid-conduction thermal contact with the single thermal shield, and a second stage in solid-conduction thermal contact with the superconductive main coil. With liquid-helium cooling of a closed magnet, the superconductive coil assembly includes a superconductive main coil which is at least partially immersed in liquid helium contained in a helium dewar which is surrounded by a dual thermal shield which is surrounded by a vacuum enclosure. It is known to reduce helium boil-off in closed magnets by adding a cryocooler whose first stage is in solid-conduction thermal contact with the outer one of the two spaced-apart thermal shields of the dual thermal shield and whose second stage is in solid-conduction thermal contact with the inner one of the two spaced-apart thermal shields of the dual thermal shield. It is also known to reduce helium boil-off by employing a condenser to re-liquefy the helium vapor, wherein the condenser is in thermal contact with the second stage of a cryocooler coldhead and is in physical contact with the helium vapor in the dewar.

Known open magnets are solid-conduction cryocooler-cooled and typically employ two spaced-apart superconductive coil assemblies with the open space between the assemblies allowing for access by medical personnel for surgery or other medical procedures during MRI imaging. The patient may be positioned in that open space or also in the bore of the toroidal-shaped coil assemblies. The open space helps the patient overcome any feelings of claustrophobia that may be experienced in a closed magnet design. A cryocooler coldhead attached to one superconductive coil assembly can cool the second superconductive coil assembly by solid-conduction cooling through the structural posts which attach together the spaced-apart superconductive coil assemblies. The literature is silent on helium-cooled open magnets, presumably because the superconductive main coil structurally cannot be located longitudinally close enough to the open space to allow only a cost-effective amount of superconductor main coil to be used for MRI imaging. What is needed is a helium-cooled open MRI superconductive magnet.

SUMMARY OF THE INVENTION

It is an object of the invention to provide a cryogenic-liquid-cooled open superconductive MRI magnet.

The open MRI magnet of the invention includes a vacuum enclosure, a thermal shield located within and generally spaced apart from the vacuum enclosure, a dewar located within and generally spaced apart from the thermal shield, generally annular-shaped first and second superconductive main coils, a cryocooler coldhead, and a condenser. The vacuum enclosure, thermal shield, and dewar each have nested first portions and nested second portions hermetically or thermally connected together by at least two nested tube, tubular section, and tubular segment arrangements. The first main coil is located within the first portion of the vacuum enclosure, and the second main coil is located within the second portion of the vacuum enclosure. The cryocooler coldhead has a housing connected to the vacuum enclosure and a cold stage operatively connected to the housing. The cold stage has a temperature cold enough to re-liquefy cryogenic gas boiled-off from the cryogenic liquid contained in the dewar. The condenser is located in thermal contact with the cold stage and is positioned in physical contact with the cryogenic gas.

In an exemplary embodiment, the thermal shield is the only thermal shield located within the vacuum enclosure and positioned within the dewar. Preferably, the condenser is located completely within the first portion of the dewar. In a desired enablement, the cold stage is located completely outside the first portion of the dewar.

Several benefits and advantages are derived from the invention. Applicant's open magnet design overcomes any claustrophobic feelings of patients and gives access to the patient by medical personnel for surgery or other medical procedures during MRI imaging. Applicant's cryogenic-liquid-cooled design is less expensive than known cryocooler-cooled designs. Applicants' condenser and cryocooler coldhead arrangement re-liquefies boiled-off cryogenic gas. This allows only one thermal shield to be used which means that the superconductive main coils structurally can be located longitudinally (and radially) close to the magnet's open space which reduces the cost of the magnet by reducing the amount of superconductor main coil needed for the same-strength magnetic field.

BRIEF DESCRIPTION OF THE DRAWINGS

The accompanying drawings illustrate a preferred embodiment of the present invention wherein.

DETAILED DESCRIPTION OF THE INVENTION

Figure 1:
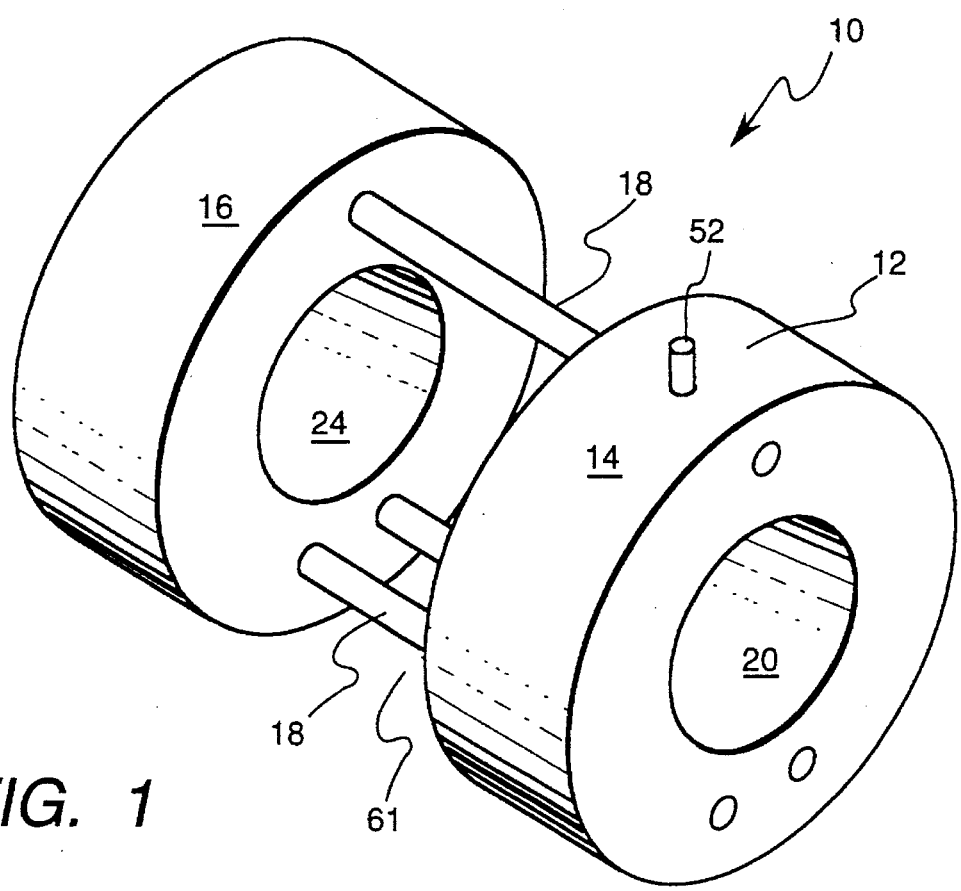
FIG. 1 is a perspective view of a preferred embodiment of the open MRI magnet of the invention.
Figure 3:
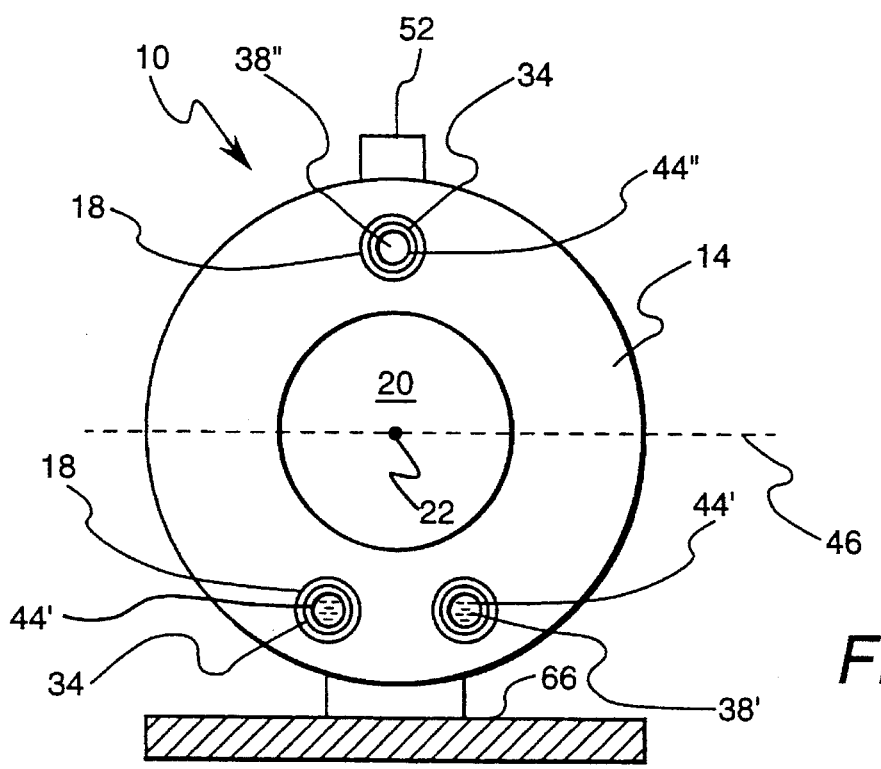
FIG. 3 is a schematic cross-sectional view of the MRI magnet of FIGS. 1 and 2 taken along the lines 3—3 of FIG. 2.
Figure 2:
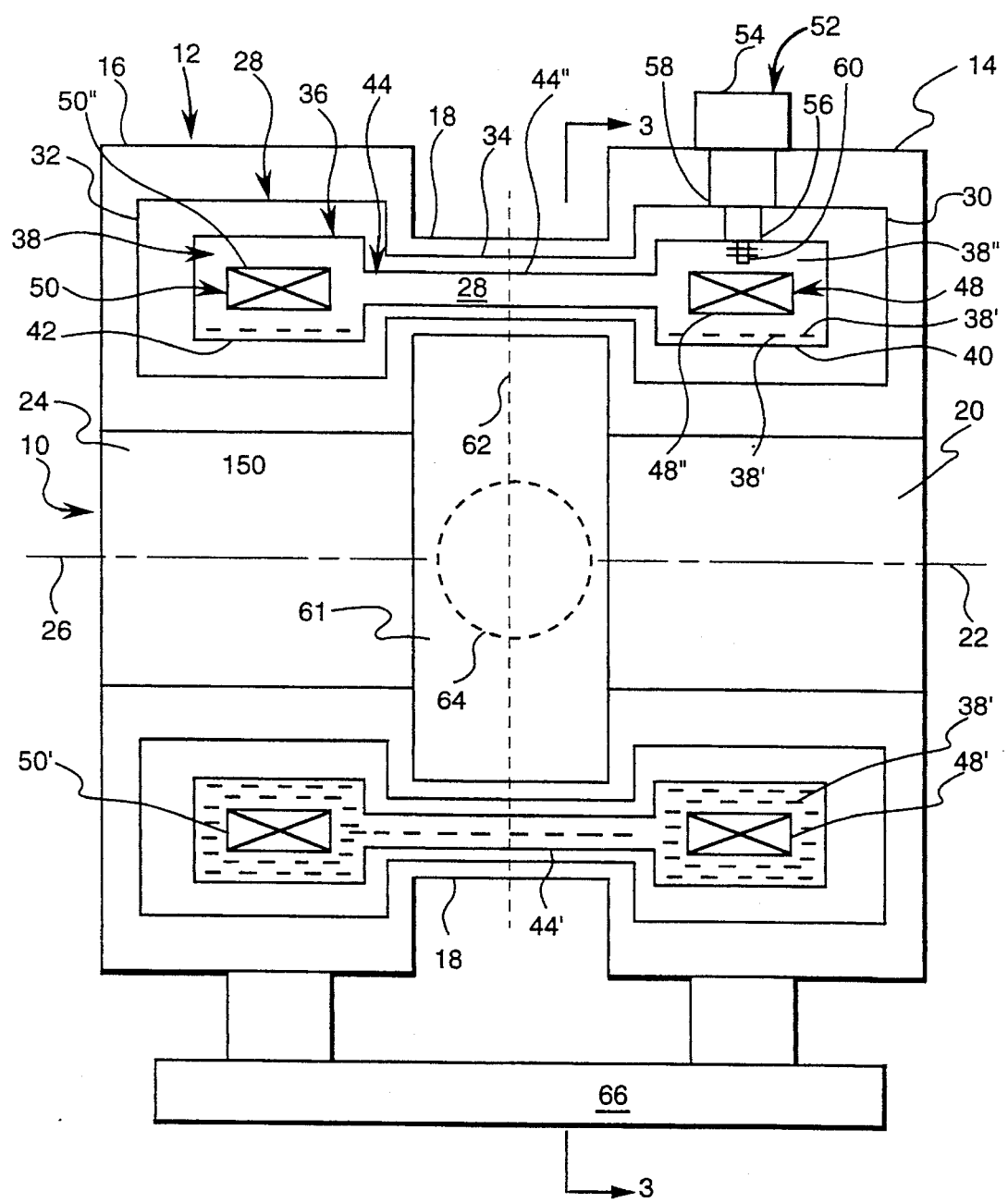
FIG. 2 is a schematic cross-sectional side-elevational view of the MRI magnet of FIG. 1 with a magnet floor mount added.

Referring now to the drawings, wherein like numerals represent like elements throughout, FIGS. 1-3 show a first preferred embodiment of the open magnetic resonance imaging (MRI) magnet 10 of the present invention. The magnet 10 includes a vacuum enclosure 12. The vacuum enclosure 12 has a generally toroidal-shaped first portion 14, a generally toroidal-shaped second portion 16, and a plurality of tubes 18. The first portion 14 surrounds a first bore 20 and has a generally longitudinal first axis 22. The second portion 16 is longitudinally spaced apart from the first portion 14, surrounds a second bore 24, and has a generally longitudinal second axis 26 generally coaxially aligned with the first axis 22. It is noted that the first portion 14 of the vacuum enclosure 12 together with other elements of the magnet 10 disposed therein are commonly referred to as the first superconductive coil assembly, and that the second portion 16 of the vacuum enclosure 12 together with other elements of the magnet 10 disposed therein are commonly referred to as the second superconductive coil assembly. The tubes 18 each have a first end hermetically connected to the first portion 14 of the vacuum enclosure 12 and have a second end hermetically connected to the second portion 16 of the vacuum enclosure 12. It is noted that in a particular application, the tubes 18 may be non-structural tubes or structural tubes.

The magnet 10 also includes a thermal shield 28 disposed within and generally spaced-apart from the vacuum enclosure 12. The thermal shield 28 has a generally toroidal-shaped first portion 30 and a generally toroidal-shaped second portion 32. The first portion 30 is disposed within and is generally spaced apart from the first portion 14 of the vacuum enclosure 12, and the second portion 32 is disposed within and is generally spaced apart from the second portion 16 of the vacuum enclosure 12. The thermal shield 28 also has a tubular section 34 disposed within and generally spaced apart from at least some (and preferably all) of the tubes 18 of the vacuum enclosure 12. The tubular section 34 has a first end thermally connected to the first portion 30 of the thermal shield 28 and has a second end thermally connected to the second portion 32 of the thermal shield 28. Conventional thermally-insulative spacers (not shown) separate spaced-apart elements, as is known to the artisan.

The magnet 10 additionally includes a dewar 36 disposed within and generally spaced apart from the thermal shield 28. The dewar 36 contains a cryogenic fluid 38 which includes a cryogenic liquid 38' and a cryogenic gas (i.e., vapor) 38" boiled-off from the cryogenic liquid 38'. Preferably, the cryogenic liquid 38' consists essentially of (and preferably consists of) liquid helium. In this preferred arrangement, the cryogenic gas (i.e., vapor) 38" consists essentially of (and preferably consists of) helium gas (i.e., helium vapor) boiled-off from the liquid helium. The dewar 36 has a generally toroidal-shaped first portion 40 containing some of the cryogenic liquid 38' and some of the cryogenic gas 38", and the dewar 36 has a generally toroidal-shaped second portion 42 containing some of the cryogenic liquid 38' and some of the cryogenic gas 38". The first portion 40 is disposed within and is generally spaced apart from the first portion 30 of the thermal shield 28, and the second portion 42 is disposed within and is generally spaced apart from the second portion 32 of the thermal shield 28. The dewar 36 also has a tubular segment 44 disposed within and generally spaced apart from at least some (and preferably all) of the tubular sections 34 of the thermal shield 28. The tubular segment 44 has a first end hermetically connected to the first portion 40 of the dewar 36 and has a second end hermetically connected to the second portion 42 of the dewar 36. It is noted that the vacuum enclosure 12, thermal shield 28, and dewar 36, broadly summarized, each have nested first portions 14, 30, & 40 and nested second portions 16, 32, & 42 hermetically or thermally connected together by at least two nested tube 18, tubular section 34, and tubular segment 44 arrangements.

Preferably, the tubular segments 44 of the dewar 36 include a lower tubular segment 44' disposed below a horizontal plane 46 (seen on edge as a dashed line in FIG. 3) containing the first axis 22 (seen as a dashed line in FIG. 2 and seen head-on as a dot in FIG. 3) and includes an upper tubular segment 44" disposed above the horizontal plane 46. In an exemplary arrangement, the lower tubular segment 44' contains matter consisting essentially of (and preferably consisting of) some of the cryogenic liquid 38', and the upper tubular segment 44" contains matter consisting essentially of (and preferably consisting of) some of the cryogenic gas 38". It is noted from FIG. 2 that the cryogenic liquid 38' in the first portion 40 of the dewar 36 is in fluid communication with the cryogenic liquid 38' in the second portion 42 of the dewar 36 through the lower tubular segment 44' of the dewar 36, and that the cryogenic gas (i.e., vapor) 38" in the first portion 40 of the dewar 36 is in fluid communication with the cryogenic gas (i.e., vapor) 38" in the second portion 42 of the dewar 36 through the upper tubular segment 44" of the dewar 36. In other words, the tubular segments 44 fluidly interconnect the first and second portions 40 and 42 of the dewar 36. Preferably, the dewar 36 has two lower tubular segments 44' and one upper tubular segment 44". In an exemplary construction, the upper tubular segment 44" of the dewar 36 is in fluid communication with a service stack (not shown) longitudinally disposed generally midway between the first and second portions 14 and 16 of the vacuum enclosure 12.

The magnet 10 further includes a generally annular-shaped first superconductive main coil 48 and preferably includes generally annular-shaped additional superconductive main coils (not shown in the figures). The additional superconductive main coils may be needed to achieve a high magnetic field strength, within the magnet's imaging volume, without exceeding the critical current density of the superconductor being used in the coils, as is known to those skilled in the art. The first superconductive main coil 48 is conventionally supported on a coil form (not shown in the figures). The first superconductive main coil 48 is generally coaxially aligned with the first axis 22, is disposed within the first portion 14 of the vacuum enclosure 12, and is disposed in thermal contact with the cryogenic fluid 38. Examples of such thermal contact include, but are not limited to, the first superconductive main coil 48 being disposed within the first portion 40 of the dewar 36 and at least partially immersed in the cryogenic liquid 38' (as shown in FIG. 2) or being disposed outside, and in solid-conduction thermal contact with, the outer or inner circumferential outside surface of the first portion 40 of the dewar 36 (not shown in the figures). The first superconductive main coil 48 preferably is a superconductive wire or superconductive tape wound such that the first superconductive main coil 48 has a longitudinal extension and a radial extension (i.e., radial thickness) far greater than the corresponding dimensions of the superconductive wire or superconductive tape. In an exemplary construction, Nb-Ti superconductive tape is used for the first superconductive main coil 48. Preferably, the first superconductive main coil 48 includes a lower portion 48' disposed below the horizontal plane 46 and immersed in some of the cryogenic liquid 38' and includes an upper portion 48" disposed above the horizontal plane 46 and in physical contact with some of the cryogenic gas 38".

The magnet 10 moreover includes a generally annular-shaped second superconductive main coil 50 generally coaxially aligned with the second axis 26, disposed within the second portion 16 of the vacuum enclosure 12, and disposed in thermal contact with the cryogenic fluid 38. It is noted that additional superconductive main coils would be needed within the second portion 16 of the vacuum enclosure 12 to balance any additional superconductive main coils used in the first portion 14 of the vacuum enclosure 12, as can be appreciated by those skilled in the art. The second superconductive main coil 50 is conventionally supported on a coil form (not shown in the figures). In an exemplary construction, the second superconductive main coil 50 is generally identical to the first superconductive main coil 48 with both coils carrying an electric current in the same generally circumferential direction. Preferably, the second superconductive main coil 50 includes a lower portion 50' disposed below the horizontal plane 46 and immersed in some of the cryogenic liquid 38' and includes an upper portion 50" disposed above the horizontal plane 46 and in physical contact with some of the cryogenic gas 38".

The magnet 10 yet includes a cryocooler coldhead 52, such as, but not limited to, the cryocooler coldhead of a Gifford-McMahon cryocooler. The cryocooler coldhead 52 has a housing 54 connected to the vacuum enclosure 12 and has a cold stage 56 operatively connected to the housing 54. The cold stage 56 has a temperature cold enough to re-liquefy the cryogenic gas (i.e., vapor) 38". Cryocooler coldheads have one or more (cold) stages, as is known to those skilled in the art. In a preferred construction, the magnet 10 employs a two-stage cryocooler coldhead 52 whose first stage 58 is in thermal contact with the thermal shield 28, whose second stage is the previously described cold stage 56, and whose cold (i.e., second) stage 56 is colder than the first stage 58. For a particular application, the magnet 10 of the invention may employ a single stage or three (or more) stage cryocooler coldhead (not shown in the figures), as can be appreciated by the artisan. Details of the attachment and thermal connections of the cryocooler coldhead 52 to the vacuum enclosure 12, thermal shield 28, and/or dewar 36 do not form a part of this invention, have been omitted from the figures for clarity, and are within the level of skill of the artisan. However, in a preferred arrangement, the cryocooler coldhead is inserted into a recess-sleeve portion of the vacuum enclosure so that the cryocooler coldhead may be removed without breaking the vacuum in the vacuum enclosure. Here a very small area of the thermal shield would be in thermal (and typically physical) contact with a small area of the recess-sleeve portion of the vacuum enclosure, and a very small area of the dewar would be in thermal (and typically physical) contact with a small area of the recess-sleeve portion of the vacuum enclosure, as can be appreciated by those skilled in the art.

The magnet 10 as well includes a condenser 60 disposed in thermal contact with the cold stage 56 of the cryocooler coldhead 52 and disposed in physical contact with the cryogenic gas (i.e., vapor) 38". Condensers are usually metallic, have high coefficients of thermal conductivity, and have large surface areas upon which gas (i.e., vapor) condenses into liquid when the surface temperature is cold enough for condensation to occur. The term "condenser" includes, without limitation, "re-condenser" for the case where the gas (i.e., vapor) has evaporated (i.e., boiled-off) from a liquid. A preferred condenser 60 has, without limitation, fins and/or tubes made of copper and/or aluminum. In an exemplary enablement, the condenser 60 is disposed at least partially within the dewar 36. Preferably, the condenser 60 is disposed completely within and in thermal contact with the first portion 40 of the dewar 36, and the cold stage 56 is disposed completely outside and in thermal contact with the first portion 40 of the dewar 36. It is noted that the cryocooler coldhead 52 and condenser 60 arrangement helps reduce boil-off of the cryogenic-liquid 38' which allows for a single thermal shield 28 design (instead of a conventional dual thermal shield design) to be used in the magnet 10. That is, the thermal shield 28 preferably is the only thermal shield which is disposed within the vacuum enclosure 12 and which has disposed within itself the dewar 36. The single thermal shield 28 allows the first and second superconductive main coils 48 and 50 structurally to be located longitudinally (and radially, if desired) close to the magnet's open space 61 (i.e., the cylindrical-shaped open space located longitudinally between the first and second portions 14 and 16 of the vacuum enclosure 12) which reduces the cost of the magnet 10 by reducing the amount of superconductor main coil needed for the same-strength magnetic field.

Preferably, the first superconductive main coil 48, the first portion 40 of the dewar 36, the first portion 30 of the thermal shield 28, and the first portion 14 of the vacuum enclosure 12 are generally mirror images, respectively, of the second superconductive main coil 50, the second portion 42 of the dewar 36, the second portion 32 of the thermal shield 28, and the second portion 16 of the vacuum enclosure 12 about a plane 62 (seen on edge as a dashed line in FIG. 2) oriented perpendicular to the first axis 22 and disposed longitudinally midway between the first and second portions 14 and 16 of the vacuum enclosure 12. The superconductive main coils 48 and 50 of the magnet 10 typically produce a generally spherical imaging volume 64 (shown as a dotted circle in FIG. 2) centered generally at the intersection of the plane 62 and the first axis 22. It is noted that the magnet 10 is supported on a conventional magnet floor mount 66.

Although not shown in the figures, it is noted (as previously suggested) that the first superconductive main coil 48 may be disposed completely outside of and in solid-conduction thermal contact with the first portion 40 of the dewar 36, and that the second superconductive main coil 50 may be disposed completely outside of and in solid-conduction thermal contact with the second portion 42 of the dewar 36. Positioning the superconductive main coils 48 and 50 completely outside of the dewar 36, while still being cooled by the cryogenic fluid 38 within the dewar 36 by solid conduction from the walls of the dewar 36, also allows the first and second superconductive main coils 48 and 50 structurally to be located longitudinally (and radially, if desired) close to the magnet's open space 61 which reduces the cost of the magnet 10 by reducing the amount of superconductor main coil needed for the same-strength magnetic field.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. An open magnetic resonance imaging magnet comprising:

a) a vacuum enclosure including:
      (1) a generally toroidal shaped first portion surrounding a first bore and having a generally longitudinal first axis;
      (2) a generally toroidal-shaped second portion longitudinally spaced apart from said first portion, surrounding a second bore, and having a generally longitudinal second axis generally coaxially aligned with said first axis; and
      (3) a plurality of tubes each having a first end hermetically connected to said first portion of said vacuum enclosure and having a second end hermetically connected to said second portion of said vacuum enclosure;

b) a thermal shield disposed within and generally spaced-apart from said vacuum enclosure, said thermal shield including:

(1) a generally toroidal-shaped first portion disposed within and generally spaced apart from said first portion of said vacuum enclosure;

(2) a generally toroidal-shaped second portion disposed within and generally spaced apart from said second portion of said vacuum enclosure; and (3) a tubular section disposed within and generally spaced apart from at least some of said tubes of said vacuum enclosure, said tubular section having a first end thermally connected to said first portion of said thermal shield and having a second end thermally connected to said second portion of said thermal shield;

c) a dewar disposed within and generally spaced apart from said thermal shield, said dewar containing a cryogenic fluid including a cryogenic liquid and a cryogenic gas boiled-off from said cryogenic liquid, said dewar including:

(1) a generally toroidal-shaped first portion containing some of said cryogenic liquid and some of said cryogenic gas and disposed within and generally spaced apart from said first portion of said thermal shield;

(2) a generally toroidal-shaped second portion containing some of said cryogenic liquid and some of said cryogenic gas and disposed within and generally spaced apart from said second portion of said thermal shield; and (3) a tubular segment disposed within and generally spaced apart from at least some of said tubular sections of said thermal shield, said tubular segment having a first end hermetically connected to said first portion of said dewar and having a second end hermetically connected to said second portion of said dewar; and d) a generally annular-shaped first superconductive main coil generally coaxially aligned with said first axis, disposed within said first portion of said vacuum enclosure, and disposed in thermal contact with said cryogenic fluid;

e) a generally annular-shaped second superconductive main coil generally coaxially aligned with said second axis, disposed within said second portion of said vacuum enclosure, and disposed in thermal contact with said cryogenic fluid;

f) a cryocooler coldhead including:

(1) a housing connected to said vacuum enclosure; and (2) a cold stage operatively connected to said housing and having a temperature cold enough to re-liquefy said cryogenic gas; and g) a condenser disposed in thermal contact with said cold stage and disposed in physical contact with said cryogenic gas.

2. The magnet of claim 1, wherein said thermal shield is the only thermal shield which is disposed within said vacuum enclosure and which has disposed within itself said dewar.

3. The magnet of claim 2, wherein said first superconductive main coil, said first portion of said dewar, said first portion of said thermal shield, and said first portion of said vacuum enclosure are generally mirror images, respectively, of said second superconductive main coil, said second portion of said dewar, said second portion of said thermal shield, and said second portion of said vacuum enclosure about a plane oriented perpendicular to said first axis and disposed longitudinally midway between said first and second portions of said vacuum enclosure.

4. The magnet of claim 3, wherein said tubular segments of said dewar include a lower tubular segment disposed below a horizontal plane containing said first axis and include an upper tubular segment disposed above said horizontal plane.

5. The magnet of claim 4, wherein said lower tubular segment contains matter consisting essentially of some of said cryogenic liquid and said upper tubular segment contains matter consisting essentially of some of said cryogenic gas.

6. The magnet of claim 5, wherein said first superconductive main coil includes a lower portion disposed below said horizontal plane and immersed in some of said cryogenic liquid and includes an upper portion disposed above said horizontal plane and in physical contact with some of said cryogenic gas, and wherein said second superconductive main coil includes a lower portion disposed below said horizontal plane and immersed in some of said cryogenic liquid and includes an upper portion disposed above said horizontal plane and in physical contact with some of said cryogenic gas.

7. The magnet of claim 1, wherein said condenser is disposed at least partially within said dewar.

8. The magnet of claim 7, wherein said condenser is disposed completely within and in thermal contact with said first portion of said dewar.

9. The magnet of claim 8, wherein said cold stage is disposed completely outside and in thermal contact with said first portion of said dewar.

10. The magnet of claim 1, wherein said cryocooler coldhead also includes a first stage in thermal contact with said thermal shield and wherein said cold stage is colder than said first stage.

* * * * *